United States Patent [19]

Pohl

[11] 4,125,794
[45] Nov. 14, 1978

[54] ELECTRONIC TOUCH KEY

[75] Inventor: Joachim Pohl, Lüdenscheid, Germany

[73] Assignee: Brown, Boveri & Cie AG, Mannheim-Käfertal, Germany

[21] Appl. No.: 808,316

[22] Filed: Jun. 20, 1977

[30] Foreign Application Priority Data

Jun. 19, 1976 [DE] Fed. Rep. of Germany ....... 2627663

[51] Int. Cl.$^2$ ............ H05B 37/02; H05B 39/06; H05B 41/04; H05B 41/18
[52] U.S. Cl. .................... 315/362; 307/252 B; 315/315; 315/DIG. 7
[58] Field of Search ............ 307/126, 139, 252 B, 307/116, 308; 315/136, 315, 362; 200/DIG. 1, DIG. 2; 361/181

[56] References Cited

U.S. PATENT DOCUMENTS

| 3,919,596 | 11/1975 | Bellis | 315/315 X |
| 4,016,453 | 4/1977 | Moennig | 315/362 X |
| 4,031,408 | 6/1977 | Holz | 307/116 |

OTHER PUBLICATIONS

Camm & Mazzotta, "Light Dimmer Operates with Touch-Contact Switches", Electronic Engineering, pp. 13-14, Jan. 1976.

Primary Examiner—Alfred E. Smith
Assistant Examiner—Robert E. Wise
Attorney, Agent, or Firm—Herbert L. Lerner

[57] ABSTRACT

Electronic touch key assembly with a metal probe having touch or keying surfaces through which, when the surfaces are contacted, a capacitive reactive current flows, triggering a switching amplifier through which an electronic valve for controlling brightness of a lamp is opened, including a high resistance serially connected to the touch or keying surfaces, the surfaces being formed of metal and being insulated from one another, a filter and a rectifier connected to the high resistance, the high resistance serving through the filter and the rectifier as a voltage source, a first and a second bistable multivibrator, the voltage source having an output connected to the second bistable multivibrator, the first bistable multivibrator being connected to the second bistable multivibrator and serving as a switching amplifier which, at a defined voltage threshold of the line voltage, sets the second bistable multivibrator into an opposite output state, a PNP transistor having a base, the second bistable multivibrator having an output connected to the base of the PNP transistor for addressing the latter, the electronic valve including a Triac, and the transistor being connected to the Triac for driving the same.

1 Claim, 1 Drawing Figure

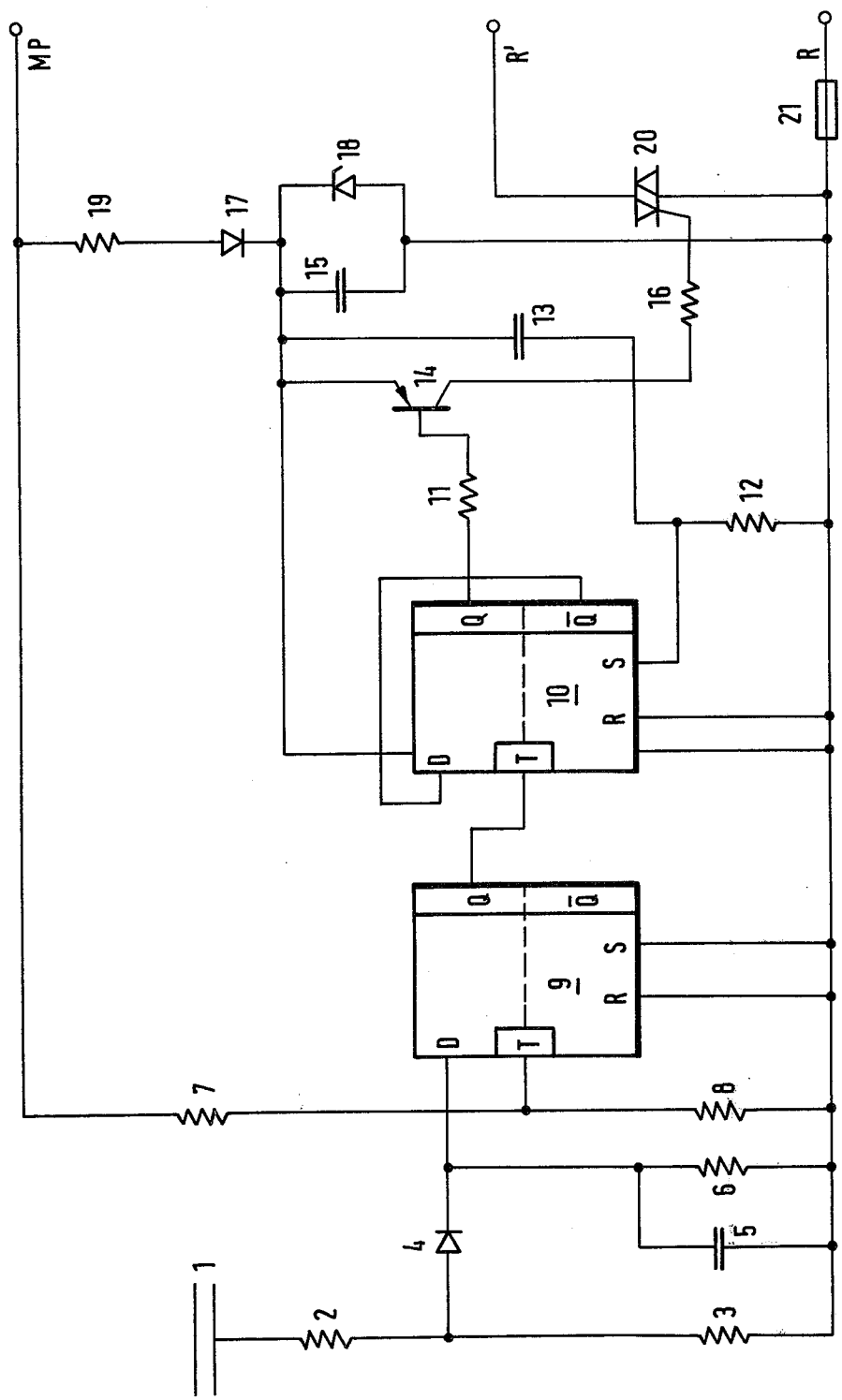

ELECTRONIC TOUCH KEY

The invention relates to an electronic touch key, particularly for installations with tightened safety requirements, with a metal probe having touch or keying surfaces through which, when the surfaces are contacted, a capacitive reactive current flows, triggering a switching amplifier through which an electronic valve for controlling brightness of a lamp is opened.

An electronic switch has become known heretofore from German Pat. No. 1,762,454, the touch or keying surfaces of which are coupled capacitively to the electronic circuitry. However, a problem exists in this prior-art electronic switch that the operating current flowing through the body is in the milliampere range; in view of present-day existing safety regulations, the current that occurs may become excessive. In order further to ensure adequate safety, the dielectric above the touch surfaces must be made relatively thick.

It is accordingly an object of the invention to provide an electronic touch key of the aforementioned type which is of considerably simpler construction and meets the safety requirements better than heretofore known touch keys of this general type. The capacity of the capacitor electrodes of the touch or keying surfaces should be relatively small, so that the dielectric can be made thin. In addition, the coupling between the d-c circuit and the a-c power dircuit should be as simple as possible.

With the foregoing and other objects in view, there is provided, in accordance with the invention, an electronic touch key assembly with a metal probe having touch or keying surfaces through which, when the surfaces are contacted, a capacitive reactive current flows, triggering a switching amplifier through which an electronic valve for controlling brightness of a lamp is opened, comprising a high resistance serially connected to the touch or keying surfaces, the surfaces being formed of metal and being insulated from one another, a filter and a rectifier connected to the high resistance, the high resistance serving through the filter and the rectifier as a voltage source, a first and a second bistable multivibrator, the voltage source having an output connected to the second bistable multivibrator, the first bistable multivibrator being connected to the second bistable multivibrator and serving as a switching amplifer which, at a defined voltage threshold of the line voltage, sets the second bistable multivibrator into an opposite output state, a PNP transistor having a base, the second bistable multivibrator having an output connected to the base of the PNP transistor for addressing the latter, the electronic valve comprising a Triac or SCR, and the transistor being connected to the Triac for driving the same.

Other features which are considered as characteristic for the invention are set forth in the appended claim.

Although the invention is illustrated and described herein as embodied in an electronic touch key, it is nevertheless not intended to be limited to the details shown, since various modifications and structural changes may be made therein without departing from the spirit of the invention and within the scope and range of equivalents of the claim.

The construction and method of operation of the invention, however, together with additional objects and advantages thereof will be best understood from the following description of specific embodiments when read in connection with the accompanying drawing, in which the single FIGURE of the drawing which is a circuit diagram of an electronic touch key assembly constructed in accordance with the invention.

Referring now to the FIGURE of the drawing, there is shown therein a touch surface 1 formed of two metal electrodes which are connected to the phase R through two series-connected resistors 2 and 3. The anode of a diode 4 is connected to the junction of the two resistors 2 and 3. The cathode of the diode 4 is connected to the D-input of a first bistable multivibrator 9, also referred to herein as the flipflop 9, and respective sides of a capacitor 5 and a resistor 6 forming a parallel circuit. The other sides of the capacitor 5 and the resistor 6 are connected to the phase R. The clock input of the flipflop 9 is connected to one end of respective resistors 7 and 8. The other end of the resistor 7 is connected to the neutral conductor Mp, and the other end of the resistor 8 to the phase R. Setting and resetting inputs $s$ and $r$ of the flipflop 9 are likewise connected to the phase R. The output $\overline{Q}$ of the flipflop 9 is not connected.

The clock input of a second bistable multivibrator 10, also referred to herein as the flipflop 10, is connected to the output Q of the flipflop 9. In the case of the flipflop 10, the output $\overline{Q}$ thereof is connected to the D-input thereof, and the reset input $r$ thereof to the phase R. The setting input $s$ of the flipflop 10 is connected through a resistor 12 to the phase R and through a capacitor 13 to the positive d-c voltage pole of a d-c voltage supply, which is available at the junction point between a capacitor 15 and a Zener diode 18. The output Q of the flipflop 10 is tied via a resistor 11 to the base of a PNP transistor 14. The emitter of the transistor 14 is connected to the positive d-c voltage pole. The collector of the transistor 14 is connected through the resistor 16 to the gate of a Triac SCR 20. The parallel circuit formed of the capacitor 15 and the Zener diode 18, with the anode of the Zener diode, are connected to the phase R. The cathode of the Zener diode 18 is connected to the cathode of a diode 17, the anode of which, in turn, is tied to a resistor 19, which is connected to a neutral conductor Mp. A fuse 21 is inserted into the lead to the phase R.

The electronic touch key of the invention operates as follows:

In the initial state, the Triac 20 is non-conducting and the connected load consequently carries no current.

When the touch surface 1 is touched, a small a-c current (capacitive reactive current) flows from the phase R via the resistors 2 and 3 through the capacitance of the touch surface. At the resistor 3, the current causes a voltage drop, which is rectified by the diode 4. The capacitor 5 is charged and smoothes the rectified voltage which is fed to the high-resistance input D of the CMOS circuit of the flipflop 9. The resistor 6 is therefore the only load for the voltage at the capacitor 5. The applied voltage corresponds to the logical "1" signal. The resistors 7 and 8 form a voltage divider at the clock input T of the flipflop 9. At the resistor 8, a voltage appears which is sinusoidal as long as it does not attain the amplitude of the supply voltage. If the voltage at the resistor 8 reaches the magnitude or amplitude of the supply voltage, then the protective input diodes of the CMOS circuit become effective and the voltage is limited. Since the flipflop 9 switches over at a definite voltage level with respect to the supply voltage, the switching point can be fixed accurately by the construction or value of the resistors 7 and 8. If the clock input T of the flipflop 9 now recognizes a logical "1" signal, then it switches the output Q from "0" to "1". If the input voltage at the input of the flipflop 9 drops again, then the output Q falls back to "0" when the switching level at the input T is passed the next time. The flipflop 9 therefore acts only as a comparator and switching amplifier. The "1" signal which was reached previously, then arrives at the clock input T of the flipflop 10.

It causes the flipflop 10 to be switched to the opposite state of what it was before, since the input D of the flipflop 10 is connected to the output $\overline{Q}$ of the flipflop 10. The output Q of the flipflop 10 therefore changes its state to a "0" signal, and a base current flows in the transistor 14 through the resistor 11. The emitter-collector path of the transistor 14 then becomes conductive, and a current flows through the resistor 16 into the gate of the Triac 20. The Triac 20 becomes conductive and the load current can then flow through the load.

The switching-off process is the same for the flipflop and, for the flipflop 10, the output Q changes from "0" to "1". The transistor 14 no longer receives base current and cuts off. The Triac consequently receives no gate current any longer and, upon the next zero crossing of the a-c voltage, the Triac also cuts off and the load is currentless.

The supply voltage is generated if a negative half-wave is present at the phase R and a current flows from the neutral conductor Mp through the resistor 19, the diode 17 and the Zener diode 18, whereby the capacitor 15 is charged. During the charging time, the capacitor 15 stores enough energy, so that the circuit can continue to operate also during the next half-wave when no charging takes place.

In order to give a control pulse to the electronic circuitry when the line voltage is switched on so that the load is not connected accidentally, a pulse, which sets the flipflop 10 at the output Q to a "1" signal, is generated at the resistor 12 by means of the capacitor 13.

The fuse 21 protects the Triac against overload. With this kind of drive in the power circuit, interference suppression components can be omitted.

There is claimed:

1. Electronic touch key assembly with a metal probe having touch or keying surfaces through which, when the surfaces are contacted, a capacitive reactive current flows, triggering a switching amplifier through which an electronic valve for controlling brightness of a lamp is opened, comprising a high resistance serially connected to the touch or keying surfaces, said surfaces being formed of metal and being insulated from one another, a filter and a rectifier connected to said high resistance, said high resistance serving through said filter and said rectifier as a voltage source, a first and a second bistable multivibrator, said voltage source having an output connected to the second bistable multivibrator, said first bistable multivibrator being connected to said second bistable multivibrator and serving as a switching amplifier which, at a defined voltage threshold of the line voltage, sets said second bistable multivibrator into an opposite output state, a PNP transistor having a base, said second bistable multivibrator having an output connected to said base of said PNP transistor for addressing the latter, the electronic valve comprising a Triac, and said transistor being connected to said Triac for driving the same.

* * * * *